United States Patent
Frisch et al.

(10) Patent No.: US 7,876,566 B1
(45) Date of Patent: Jan. 25, 2011

(54) TOOLESS HEATSINK RETENTION

(75) Inventors: Andrew Harman Frisch, Austin, TX (US); Zachary Cravens, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 12/551,142

(22) Filed: Aug. 31, 2009

(51) Int. Cl.
*H05K 7/20* (2006.01)

(52) U.S. Cl. .................. 361/719; 361/703; 361/704; 257/718; 257/719; 165/80.3; 165/185

(58) Field of Classification Search ............... None
See application file for complete search history.

(56) References Cited

U.S. PATENT DOCUMENTS

| | | | |
|---|---|---|---|
| 6,618,253 B1 * | 9/2003 | Szu et al. ............... 361/719 |
| 6,648,664 B1 * | 11/2003 | McHugh et al. ............ 439/331 |
| 6,822,869 B2 * | 11/2004 | Huang et al. ............... 361/704 |
| 6,904,650 B2 * | 6/2005 | Chen et al. ................ 24/517 |
| 7,078,622 B2 * | 7/2006 | Hashimoto et al. ........... 174/60 |
| 7,123,482 B2 | 10/2006 | Barsun et al. | |
| 7,236,369 B2 * | 6/2007 | Barina et al. ............... 361/719 |
| 7,471,517 B1 | 12/2008 | Desrosiers et al. | |
| 7,768,784 B2 * | 8/2010 | Lai et al. ................. 361/710 |
| 2003/0214787 A1 * | 11/2003 | Liu ........................ 361/704 |
| 2007/0103870 A1 * | 5/2007 | Li et al. .................. 361/704 |

* cited by examiner

*Primary Examiner*—Boris L Chervinsky
(74) *Attorney, Agent, or Firm*—Haynes and Boone, LLP

(57) ABSTRACT

For retaining a heatsink in contact with a processor on a board, a plurality of spaced apart mounting studs are mounted on the board. Each mounting stud includes a pivotally mounted resilient arm and a catch. A pair of the studs are positioned such that the resilient arm of one of the studs pivots to extend to engage the resilient arm catch of an adjacent one of the studs.

23 Claims, 6 Drawing Sheets ns
US 7,876,566 B1

TOOLESS HEATSINK RETENTION

BACKGROUND

The present disclosure relates generally to information handling systems, and more particularly to a tooless heatsink retainer for use with such systems.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

A heatsink is provided to remove heat from heat producing hardware including a processor in an IHS chassis. A surface of the heatsink is urged into contact with the processor to accomplish heat transfer from the processor to the heatsink. New processors are requiring larger forces and larger sockets for the processors to provide optimum operation. To achieve the larger forces required by the new processors, previous heatsink retention devices and methods have relied on labor intensive screw installation which requires tools, or a large footprint to achieve a tooless retention. What is needed is a device and method for applying a large force to a processor via the heatsink without requiring tools such as screwdrivers, and also having the ability to require a low level force by the user in applying the large force to the processor.

Accordingly, it would be desirable to provide an improved heatsink retainer absent the disadvantages discussed above.

SUMMARY

According to one embodiment, for retaining a heatsink in contact with a processor on a board, a plurality of spaced apart mounting studs includes a pivotally mounted resilient arm and a resilient arm catch. A pair of the studs are positioned such that the resilient arm of one of the studs pivots to extend to engage the catch of an adjacent one of the studs.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
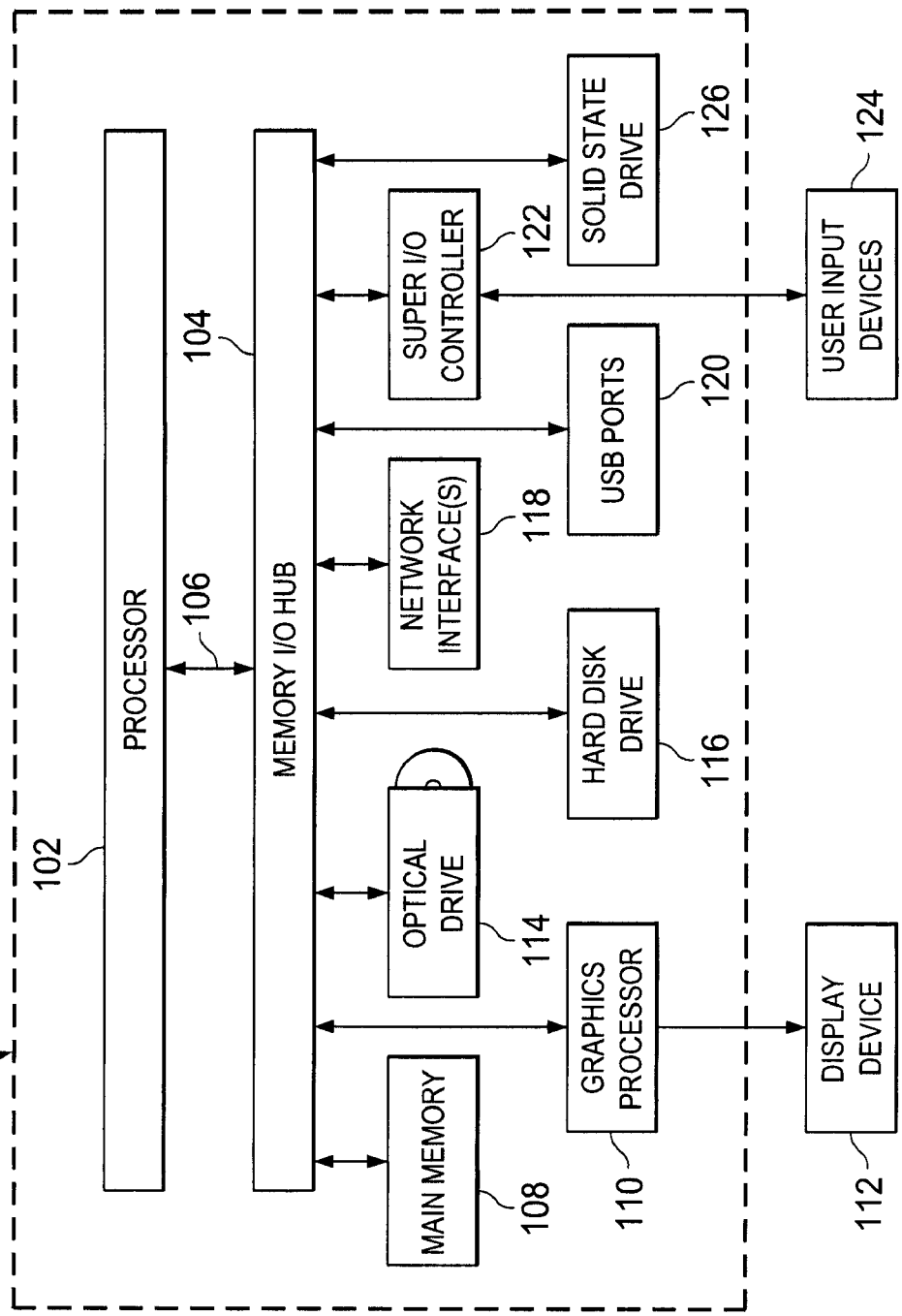
FIG. 1 is a diagrammatic view illustrating an embodiment of an information handling system (IHS).

FIG. 1 is a block diagram of an IHS 100. The IHS 100 includes a processor 102 such as an Intel Pentium™ series processor or any other processor available. A memory I/O hub chipset 104 (comprising one or more integrated circuits) connects to processor 102 over a front-side bus 106. Memory I/O hub 104 provides the processor 102 with access to a variety of resources. Main memory 108 connects to memory I/O hub 104 over a memory or data bus. A graphics processor 110 also connects to memory I/O hub 104, allowing the graphics processor to communicate, e.g., with processor 102 and main memory 108. Graphics processor 110, in turn, provides display signals to a display device 112.

Other resources can also be coupled to the system through the memory I/O hub 104 using a data bus, including an optical drive 114 or other removable-media drive, one or more hard disk drives 116, one or more network interfaces 118, one or more Universal Serial Bus (USB) ports 120, and a super I/O controller 122 to provide access to user input devices 124, etc. The IHS 100 may also include a solid state drive (SSDs) 126 in place of, or in addition to main memory 108, the optical drive 114, and/or a hard disk drive 116. It is understood that any or all of the drive devices 114, 116 and 126 may be located locally with the IHS 100, located remotely from the IHS 100, and/or they may be virtual with respect to the IHS 100. Portions of the system 100 are provided in an IHS chassis 130, FIG. 1. Other parts of the system 100 such as display 112 and input devices 124, such as a mouse and a keyboard for example are peripherally attached to the system 100.

Not all IHSs 100 include each of the components shown in FIG. 1, and other components not shown may exist. Furthermore, some components shown as separate may exist in an integrated package or be integrated in a common integrated circuit with other components, for example, the processor 102 and the memory I/O hub 104 can be combined together. As can be appreciated, many systems are expandable, and include or can include a variety of components, including redundant or parallel resources.

Figure 2:
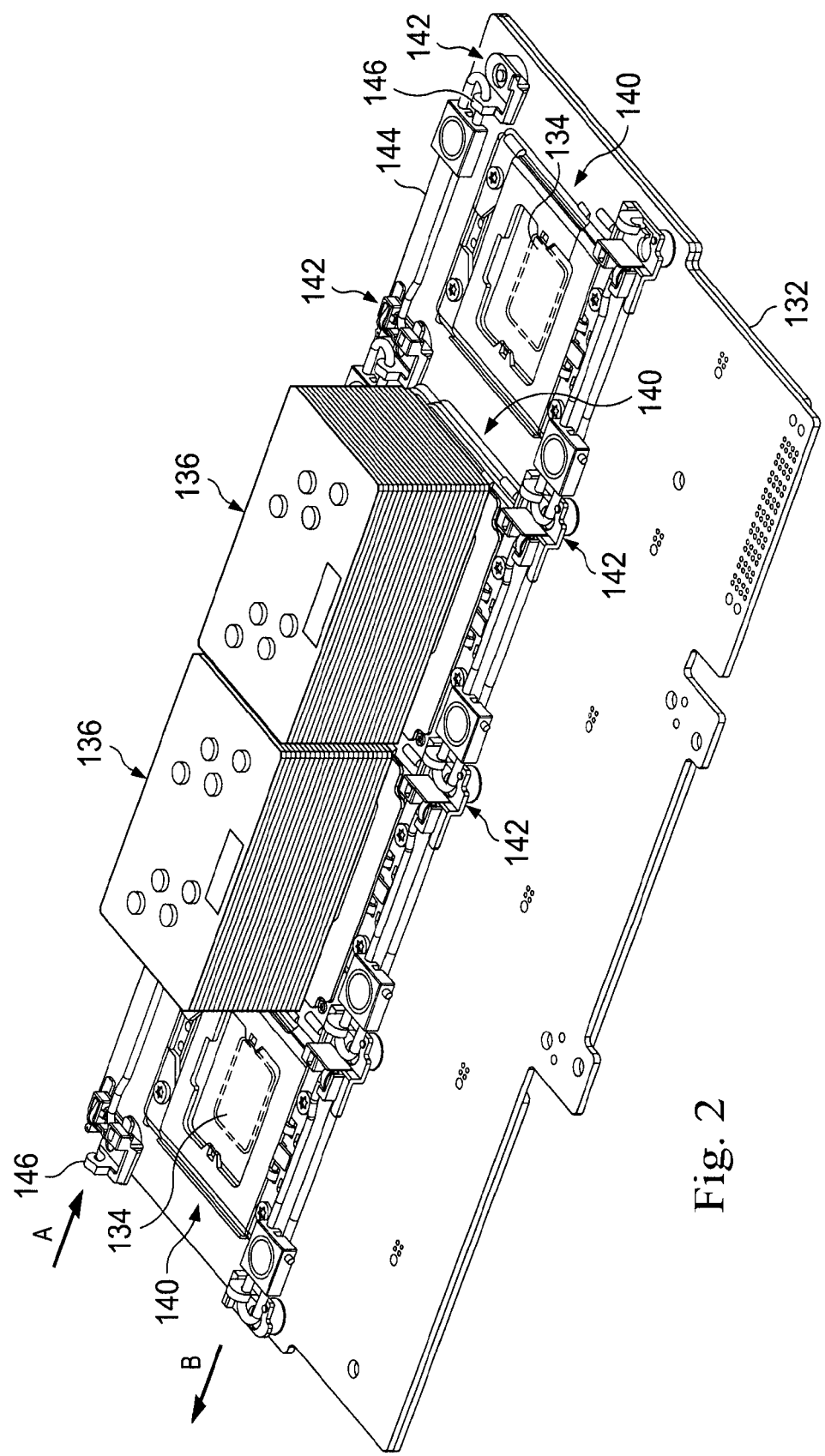
FIG. 2 is a perspective view illustrating an embodiment of heatsinks mounted on a board.
Figure 3:
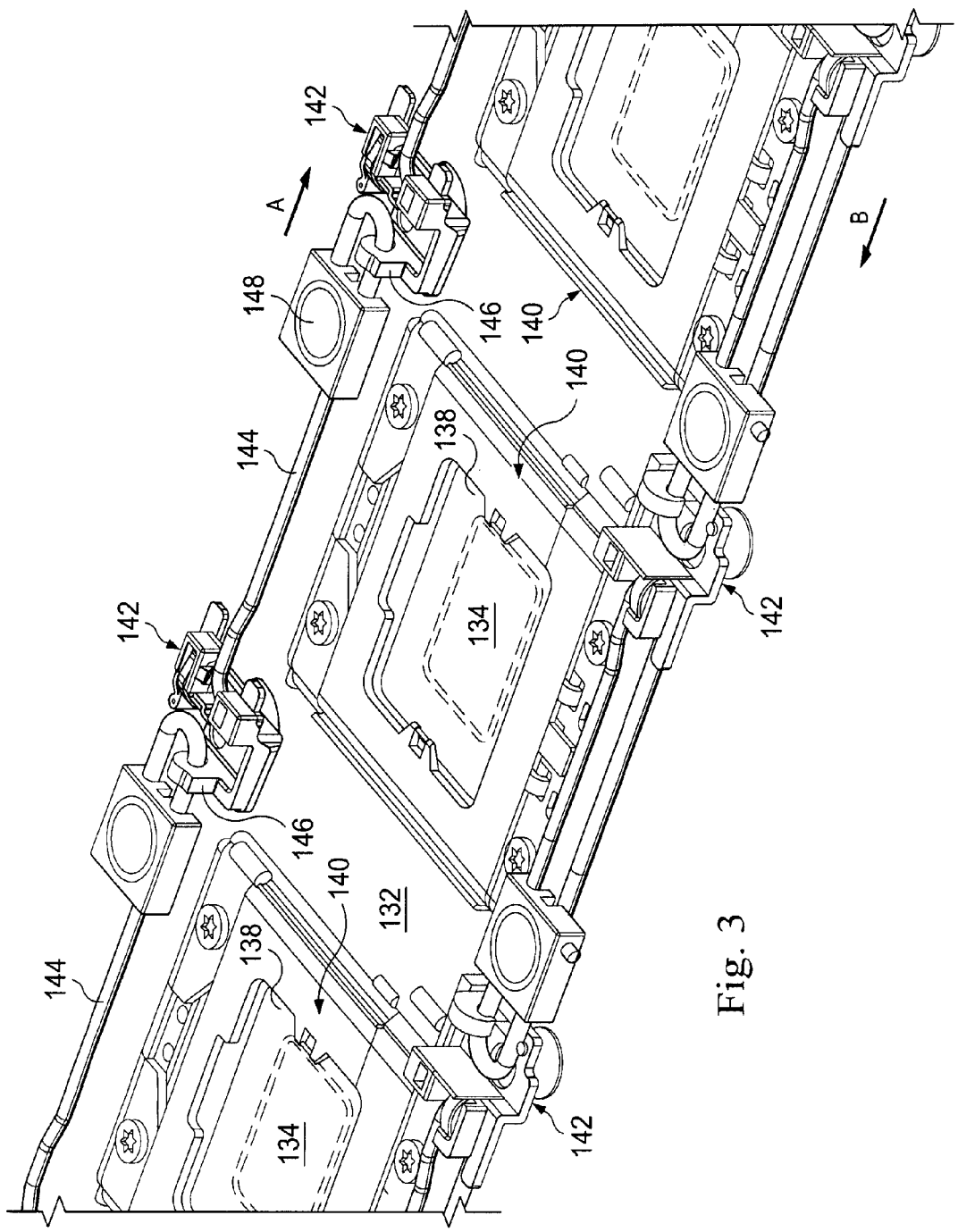
FIG. 3 is a partial perspective view illustrating an embodiment of central processing units (CPUs) mounted on a board.

A printed circuit board 132 FIG. 2, is mounted in the chassis 130 mentioned above. Hardware mounted on the board 132 includes a plurality of 4 side-by-side central processing units (CPUs) 134 in this embodiment. As an exemplary embodiment, illustrated in FIG. 2 are a pair heatsinks of 136 mounted in contact with a pair of the side-by-side CPUs 134. Of course, a heatsink would be provided for each CPU in the chassis. Referring to FIG. 3, each CPU 134 is mounted in a recess 138 defined by a support member 140. Also illustrated in FIGS. 2 and 3 are a plurality of serially arranged mounting studs 142 which are spaced apart and mounted on board 132. A first row A of the mounting studs 142 are arranged substantially parallel with a second row B of the studs 142.

Figure 4:
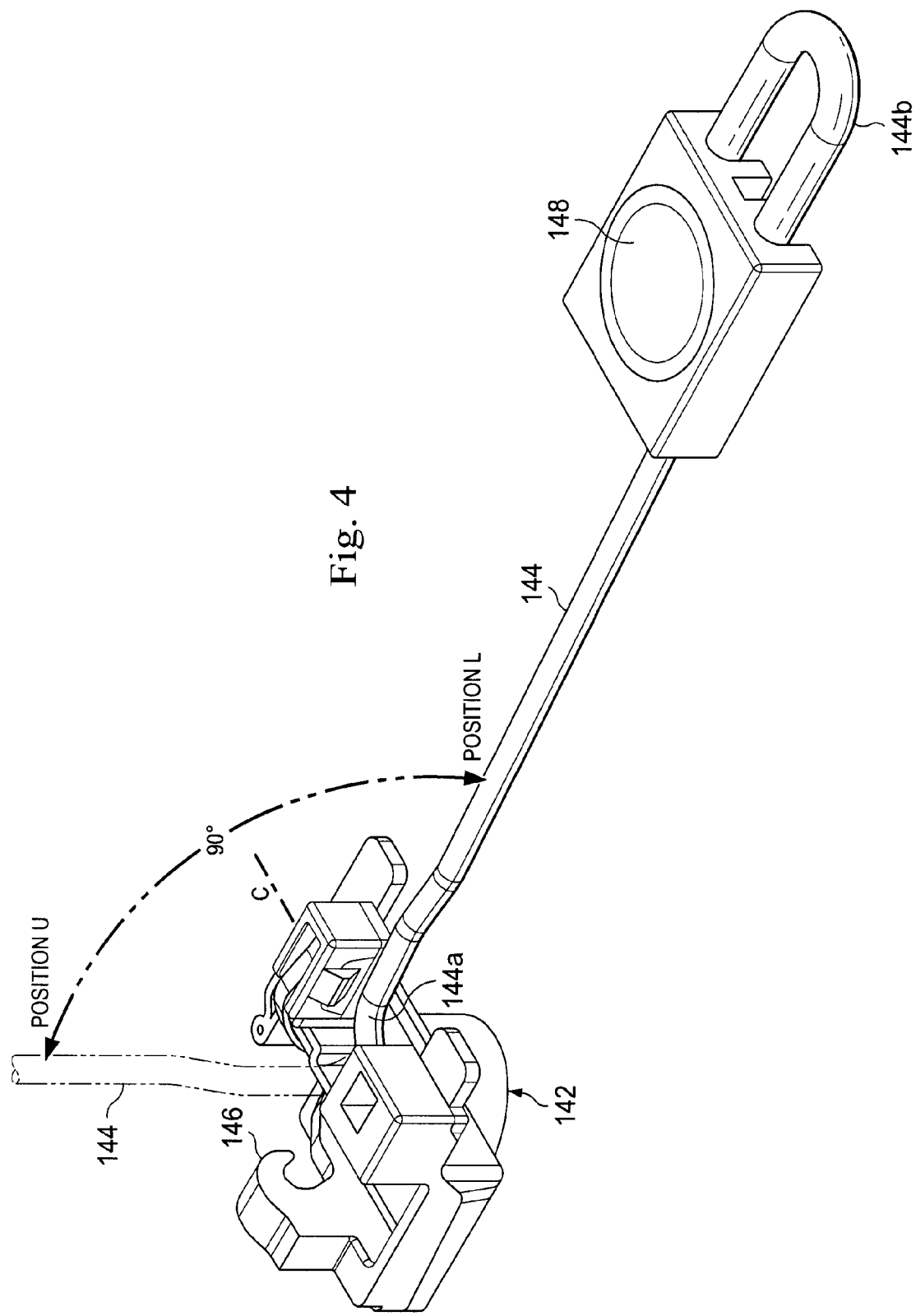
FIG. 4 is a perspective view illustrating an embodiment of a heatsink retention device.

Each of the mounting studs 142 FIGS. 2, 3, 4 include a pivotally mounted resilient arm 144 and a resilient arm catch 146. The resilient arm 144 is pivotable between a first unlatched position U and a latched position L. Each pair of the mounting studs 142 in each row A and B are positioned such that the resilient arm 144 of one of the studs pivots to extend to engage the resilient arm catch 146 of an adjacent one of the studs. A first end 144*a*, FIG. 4, of resilient arm 144 is mounted on stud 142 to pivot about a pivot axis designated C. The resilient arm catch 146 is in the form of a C-shaped hook provided on stud 142. A second end 144*b* is a U-shaped member which may be secured in the C-shaped hook of the catch 146 of an adjacent stud 142 in the same row, either A or B as shown in FIGS. 2 and 3. A user touch point or pressure point member 148 is attached to second end 144*b* of arm 144 for use when resilient arm 144 is being slightly but sufficiently bent for being urged into engagement with the C-shaped hook of catch 146 of an adjacent stud 142.

Figure 5:
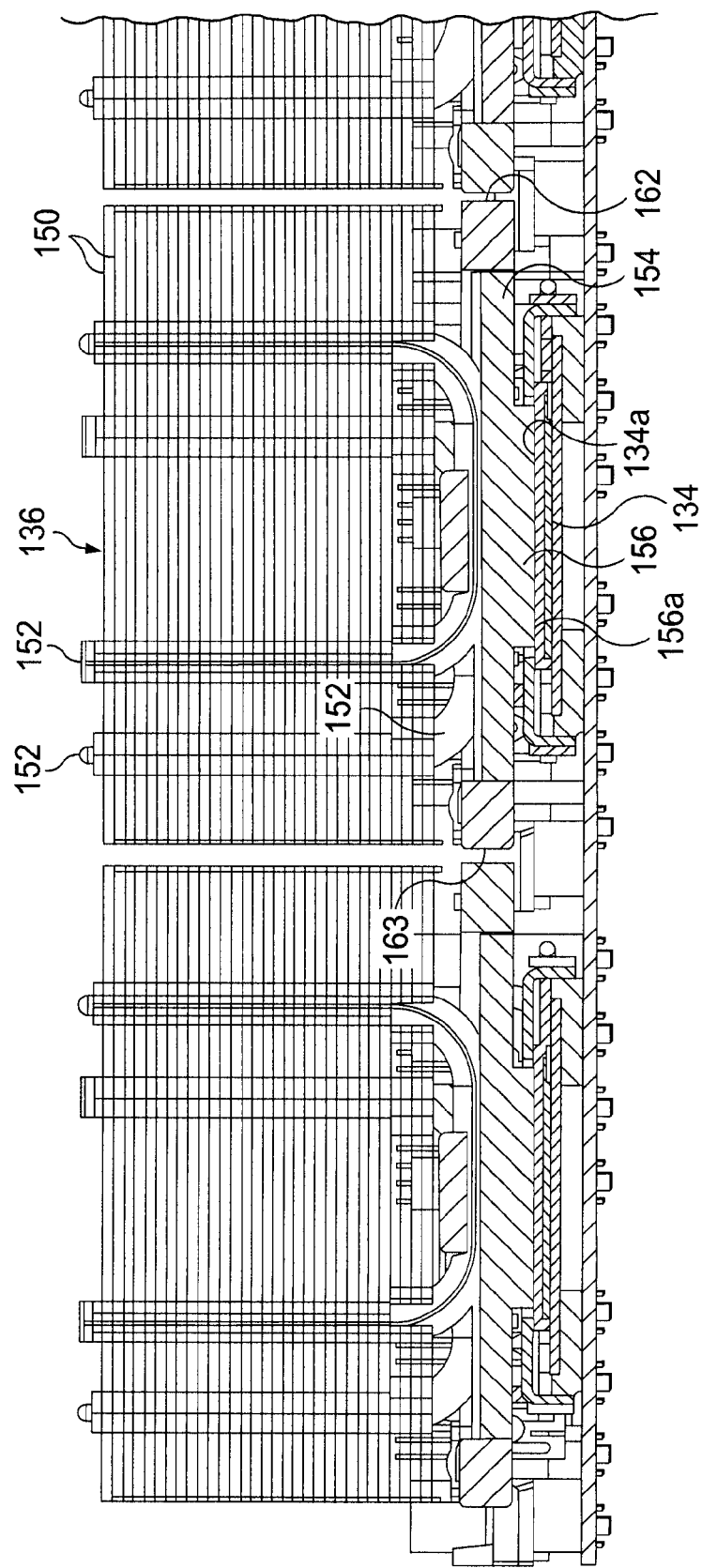
FIG. 5 is a cross-sectional side view illustrating an embodiment of heatsinks mounted on a board and in contact with CPUs.

In FIG. 5, a cross-sectional side view of the heatsink 136 illustrates a plurality of horizontally stacked fins 150 and a plurality of heat pipes 152 extending vertically through the fins 150. Each heat pipe 152 is connected to a heat sink base 154 which includes a centrally disposed plate extension 156 heaving a planar surface 156*a* in contact with a centrally disposed planar surface 134*a* of the CPU 134, thus essentially aligning these contact surfaces 134*a* and 156*a*. It is important to enhance the transfer of heat from the CPU 134 to the plate extension 156 by maintaining a contact force between the heatsink 136 and the CPU 134.

Figure 6:
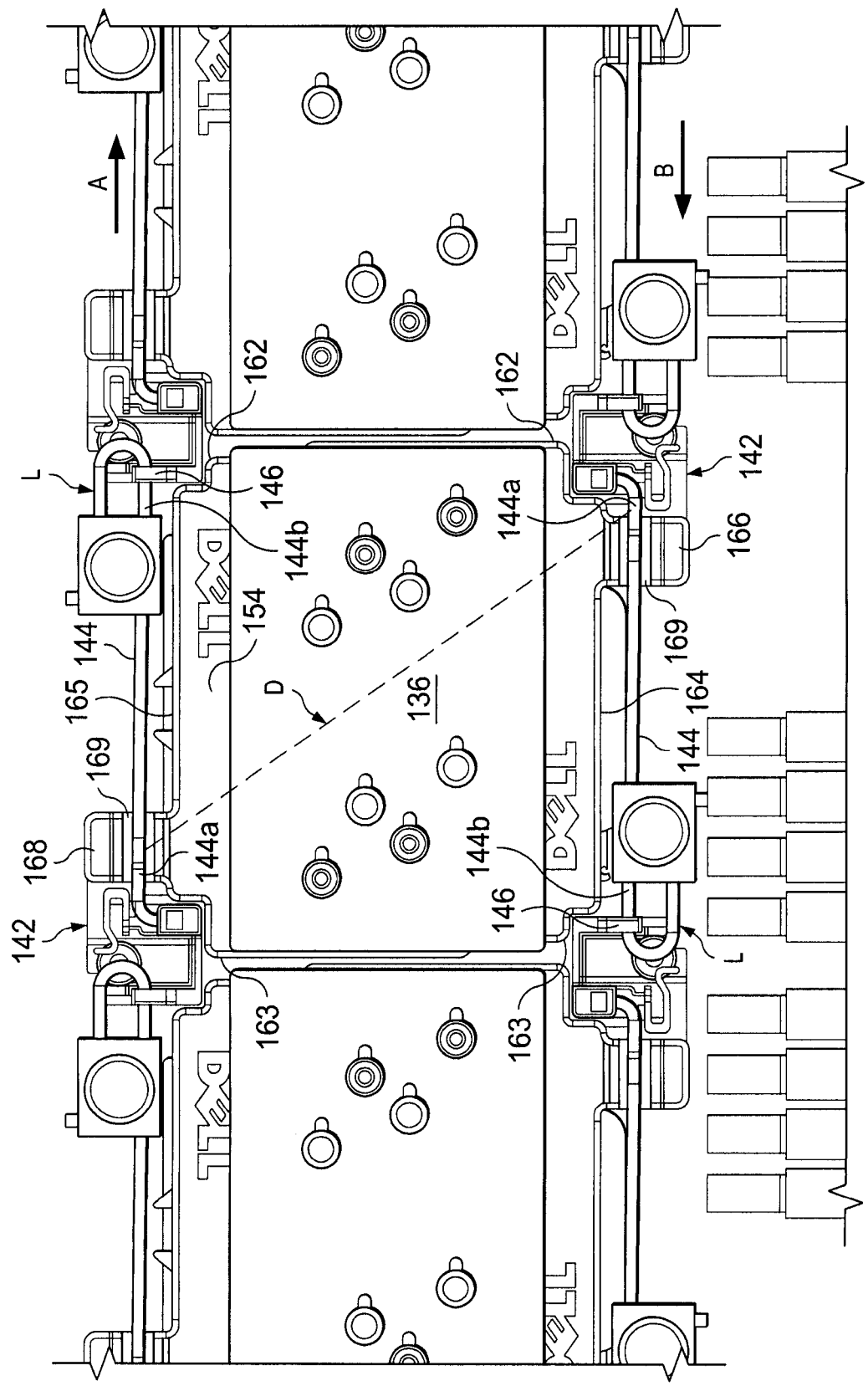
FIG. 6 is a planar view illustrating an embodiment of heatsinks retained by heatsink retention devices.

To accomplish the contact force, the heatsink base 154, see FIGS. 5 and 6, includes a first end 162, a second opposite end 163, a first side 164 and a second opposite side 165. A first base foot 166 extends from the first end 162 of the first side 164. A second base foot 168 extends from the second end 163 of the second side 165. Each base foot 166, 168, includes a groove 169.

With planar surface 156*a* seated on planar surface 134*a*, each arm 144 is rotated to position L, see FIGS. 4, 5 and 6. The first end 144*a* engages its respective groove 169 and the second end 144*b* is resiliently urged into engagement with catch 146 of an adjacent stud 142 in the same row A or B, see also FIG. 3. As a result, a force acts vertically on each foot 166 and 168 which force urges the planar surface 156*a* into a firm engagement with the planar surface 134*a*. Due to the relative positions of each foot 166, 168, i.e. diagonally disposed on heatsink base 154, the downward force acts along a diagonal line D which extends between foot 166 and foot 168, best shown in FIG. 6. Line D begins and ends where first end 144*a* of each resilient arm 144 engages the respective groove 169 of each foot 166, 168. Because line D passes essentially through the center of heatsink 136, an optimum contact force is produced between the planar faces 134*a*, 156*a*. Also due to the fulcrum provided between first end 144*a* and second end 144*b*, a reduced user force is needed to urge second end 144*b* into engagement with catch 146 when the user manually applies a force to touch point 148.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heatsink retention apparatus comprising:
    a board;
    a processor mounted on the board; and
    a plurality of spaced apart mounting studs mounted on the board, each mounting stud including a pivotally mounted resilient arm and a catch, a pair of the studs being positioned such that the resilient arm of one of the studs pivots to extend to engage the catch of an adjacent one of the studs.

2. The apparatus of claim 1, further comprising:
    a heatsink base having a first end, a second opposite end, a first side and a second opposite side;
    a first base foot extending from the first end of the first side and mounted on a first one of the mounting studs; and
    a second base foot extending from the second end of the second side and mounted on a second one of the mounting studs.

3. The apparatus of claim 2, wherein a third mounting stud is adjacent the second end of the first side and a fourth mounting stud is adjacent the first end of the second side.

4. The apparatus of claim 3 wherein a first one of the resilient arms engages the first base foot and pivots from the first mounting stud to extend in a first direction and bend into engagement with the catch of the third base foot, whereby the first base foot is resiliently urged toward the board.

5. The apparatus of claim 4 wherein a second one of the resilient arms engages the second base foot and pivots from the second mounting stud to extend in a second opposite direction and bend into engagement with the catch of the fourth base foot, whereby the second base foot is resiliently urged toward the board.

6. The apparatus of claim 1 wherein each mounting stud is identical to each other mounting stud.

7. The apparatus of claim 5, further comprising:
    a heatsink mounted on the heatsink base.

8. The apparatus of claim 7 wherein a force from the resilient arms is applied to urge the heatsink into engagement with the processor, the force being applied along a line extending diagonally across the heatsink from the first base foot to the second base foot.

9. An information handling system (IHS) comprising:
    a chassis;
    a board mounted in the chassis;
    a processor mounted on the board; and
    a plurality of spaced apart mounting studs mounted on the board, each mounting stud including a pivotally mounted resilient arm and a catch, a pair of the studs being positioned such that the resilient arm of one of the studs pivots to extend to engage the catch of an adjacent one of the studs.

10. The system of claim 9, further comprising:
    a heatsink base having a first end, a second opposite end, a first side and a second opposite side;
    a first base foot extending from the first end of the first side and mounted on a first one of the mounting studs; and
    a second base foot extending from the second end of the second side and mounted on a second one of the mounting studs.

11. The system of claim 10, wherein a third mounting stud is adjacent the second end of the first side and a fourth mounting stud is adjacent the first end of the second side.

12. The system of claim 11, wherein a first one of the resilient arms engages the first base foot and pivots from the first mounting stud to extend in a first direction and bend into engagement with the catch of the third base foot, whereby the first base foot is resiliently urged toward the board.

13. The system of claim 12, wherein a second one of the resilient arms engages the second base foot and pivots from the second mounting stud to extend in a second opposite direction and bend into engagement with the catch of the fourth base foot, whereby the second base foot is resiliently urged toward the board.

14. The system of claim 9, wherein each mounting stud is identical to each other mounting stud.

15. The system of claim 13, further comprising:
a heatsink mounted on the heatsink base and having a portion of the heatsink engaged with the processor.

16. The system of claim 15, wherein a force from the resilient arms is applied to urge the heatsink into engagement with the processor, the force being applied along a line extending diagonally across the heatsink from the first base foot to the second base foot.

17. A method of retaining a heatsink comprising:
providing a board;
mounting a processor on the board; and
mounting a plurality of spaced apart mounting studs on the board, each mounting stud including a pivotally mounted resilient arm and a catch, a pair of the studs being positioned such that the resilient arm of one of the studs pivots to extend to engage the catch of an adjacent one of the studs.

18. The method of claim 17, further comprising:
providing a heatsink base having a first end, a second opposite end, a first side and a second opposite side;
extending a first base foot from the first end of the first side and mounted on a first one of the mounting studs; and
extending a second base foot from the second end of the second side and mounted on a second one of the mounting studs.

19. The method of claim 18, wherein a third mounting stud is adjacent the second end of the first side and a fourth mounting stud is adjacent the first end of the second side.

20. The method of claim 19, wherein a first one of the resilient arms engages the first base foot and pivots from the first mounting stud to extend in a first direction and bend into engagement with the catch of the third base foot, whereby the first base foot is resiliently urged toward the board.

21. The method of claim 20, wherein a second one of the resilient arms engages the second base foot and pivots from the second mounting stud to extend in a second opposite direction and bend into engagement with the catch of the fourth base foot, whereby the second base foot is resiliently urged toward the board.

22. The method of claim 21, further comprising:
mounting a heatsink on the heatsink base.

23. The method of claim 22, wherein a force from the resilient arms is applied to urge the heatsink into engagement with the processor, the force being applied along a line extending diagonally across the heatsink from the first base foot to the second base foot.

* * * * *